(12) United States Patent
Takikawa et al.

(10) Patent No.: US 6,639,310 B2
(45) Date of Patent: Oct. 28, 2003

(54) PIN ARRANGEMENT FOR HIGH FREQUENCY INTEGRATED CIRCUIT

(75) Inventors: Kumiko Takikawa, Tama (JP); Satoshi Tanaka, Kokubunji (JP); Takashi Hashimoto, Takasaki (JP); Yoshiyuki Okabe, Shinto (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/083,547

(22) Filed: Feb. 27, 2002

(65) Prior Publication Data

US 2002/0079569 A1 Jun. 27, 2002

Related U.S. Application Data

(63) Continuation of application No. 09/547,915, filed on Apr. 11, 2000, now Pat. No. 6,407,449.

(30) Foreign Application Priority Data

Apr. 15, 1999 (JP) ............................................ 11-107545

(51) Int. Cl.[7] ............................................... H04B 1/06
(52) U.S. Cl. ...................................... 257/690; 455/132
(58) Field of Search ........................... 257/690; 455/33, 455/86, 102, 142–143, 180, 334, 552, 132, 133

(56) References Cited

U.S. PATENT DOCUMENTS 3,974,450 A    8/1976    Cunningham, Jr.
4,851,796 A    7/1989    Hendriks
5,880,601 A    3/1999    Kanazawa et al.
5,903,827 A    5/1999    Kennan et al.

OTHER PUBLICATIONS

"Dual–Band High–Linearity Variable–Gain Low–Noise Amplifiers for Wireless Applications", by Keng Leong Fong, ISSCC 1999, pp. 224–225, p. 463.

"A Single–Chip CMOS Transceiver for DCS–1800 Wireless Communications", by Michiel Steyaert, et al., ISSCC 1998, pp. 48–49, p. 411.

Primary Examiner—Minh Loan Tran
Assistant Examiner—Thomas L Dickey
(74) Attorney, Agent, or Firm—Antonelli, Terry, Stout & Kraus, LLP

(57) ABSTRACT

A pin layout which prevents degradation of a frequency characteristic of a low noise amplifier and a receiving mixer included in a semiconductor integrated circuit for dual-band transmission/reception wherein the circuit of the low noise amplifier is provided at a position where the distance from the end of a pin outside the package of the low noise amplifier to the pad is the shortest; ground pins of two low noise amplifiers and the high frequency signal pins are arranged respectively so as not to be adjacent to each other; the power source and ground pin of the low noise amplifier, and the power source and ground pin of the bias circuit are respectively separated; and high frequency signal wires do not intersect each other.

7 Claims, 5 Drawing Sheets

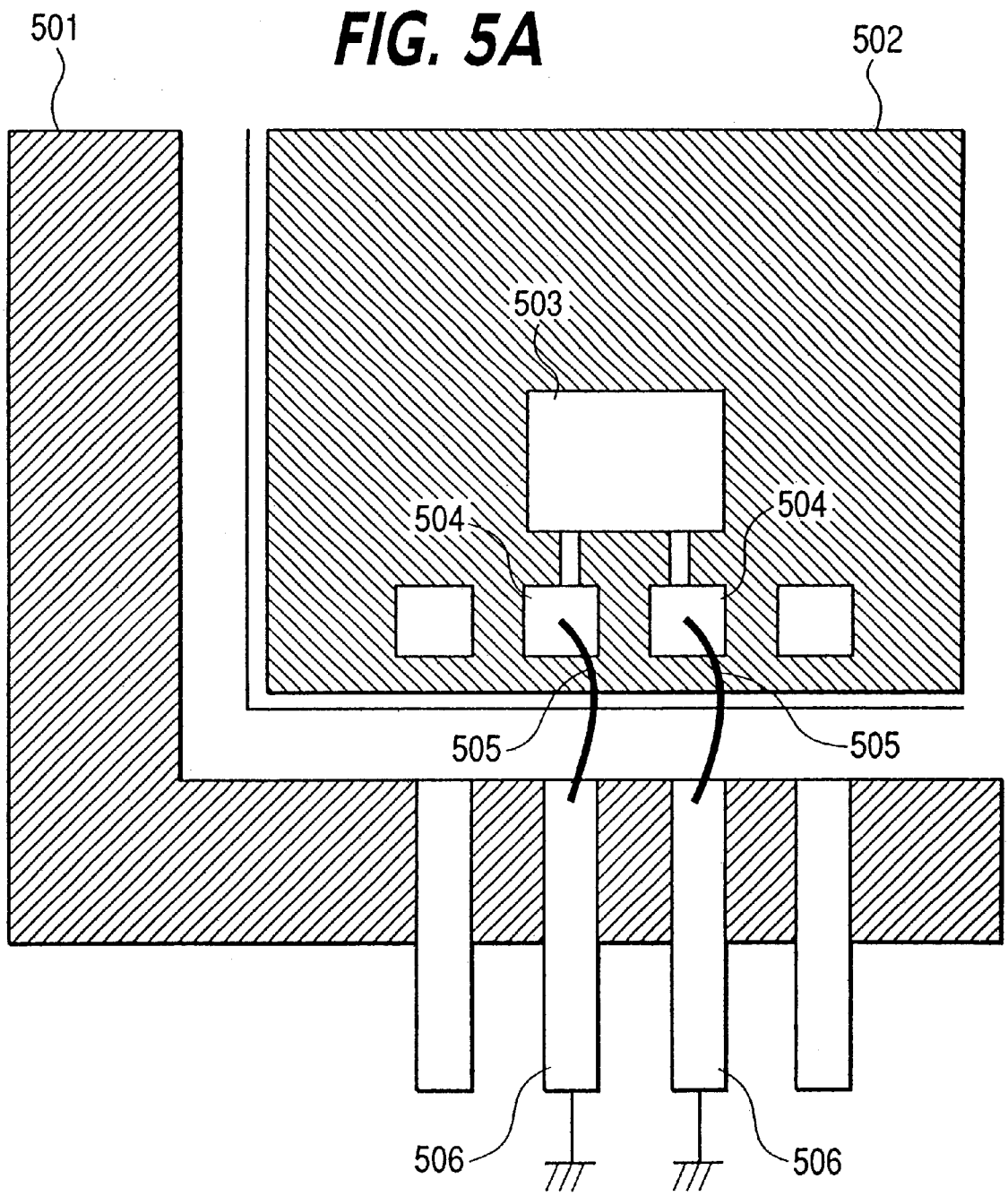

PIN ARRANGEMENT FOR HIGH FREQUENCY INTEGRATED CIRCUIT

This application is a continuation of U.S. application Ser. No. 09/547,915, filed Apr. 11, 2000, now U.S. Pat. No. 6,407,449, and the entire disclosure of which is hereby incorporated by reference.

BACKGROUND OF THE INVENTION

The present invention relates to a semiconductor integrated circuit for dual-band transmission/reception, in which a low noise amplifier is integrated, in a mobile terminal set for dual-band wireless communications, mainly applied to a wireless communication system for operating in two frequency bands, including a high frequency band and a low frequency band.

FIG. 4 shows an example of the construction of a terminal device to which a conventional semiconductor integrated circuit for dual-band transmission/reception (hereinbelow referred to as a "transmission/reception IC") is applied. This is applied to a mobile terminal of a wireless communication system for operating in two different frequency bands. A transmission/reception IC 401 has a receiving mixer 403a for the high frequency band and a receiving mixer 403b for the low frequency band, applied to the dual-band wireless communication system, a next-stage mixer 404, a variable gain amplifier 405, a demodulator 406, a modulator 408, an offset PLL 409, and a divider 407. A local oscillation signal necessary for frequency conversion is supplied from a synthesizer 410 and external RF-VCO (Voltage Controlled Oscillator) for the high frequency band 413a, RF-VCO for the low frequency band 413b, internal IF-VCO 412 and the internal divider 407. A band pass filter 411 connected to the transmission/reception IC removes out-band spurs. An amplifier 402a for the high frequency band and an amplifier 402b for the low frequency band are external devices of the IC. In the transmission part, VCO for the high frequency band 414a and VCO for the low frequency band 414b are external. The local oscillation signal from the VCO is inputted to offset PLL 409 and the frequency of the modulated signal is converted to the transmission frequency. The high power amplifier for the high frequency band 415a and the high power amplifier for the low frequency band 415b amplify the transmission signal and the band pass filter 416 removes out-band spurs. So far, it has been difficult to IC-incorporate the low noise amplifier due to shortage of gain in the high frequency band and noise characteristic by fT limitation of the transistor operation and the capacitance of the transistor substrate. However, the above problems have been overcome by recent improvements in fine processing, and so a low noise amplifier can be incorporated.

An example of a low noise amplifier applied to a dual-band transmission/reception IC is disclosed in "Dual-band High-Linearity Variable-Gain Low-Noise Amplifiers for Wireless Applications" by Keng Leong Fong, ISSCC 1999, pp. 224–225, p. 463. This construction, in which two low noise amplifiers for the dual-band transmission/reception IC are integrated as one chip and are sealed in a TSSOP20 pin package, does not include the entire transmission/reception system. Note that correspondence between the signal lines, the ground line and the like and the pads is unknown. Further, an example of a transmission/reception IC including a low noise amplifier is disclosed in "A Single-Chip CMOS Transceiver for DCS1800 Wireless Communications" by Michiel Steyaert et al., ISSCC 1998, pp. 48–49, p. 411. This construction, in which a transmission/reception circuit is integrated as one chip, is not applied to dual-band communications. Correspondence between the signal lines, the ground line and the like and the pads is unknown. Further, the package used there is unknown.

SUMMARY OF THE INVENTION

In the present invention, the low noise amplifiers 402a and 402b are newly provided in the transmission/reception circuit chip 401 for the dual-band communications, as shown in FIG. 4. In this case, problems in pin layout in the package have been found. Note that in the present invention, a Quad Flat package (hereinbelow abbreviated to "QFP") where pins are provided along four sides is employed as the package.

As a first problem, in a layout where the low noise amplifier is bonded to a long lead pin among lead pins of the QFP with a long bonding wire, the amount of feed-back by parasitic inductance is large, and the high frequency gain and noise characteristic are degraded.

As a second problem, high-frequency characteristics of the IC are similarly degraded due to transformer coupling between IC pins and transformer coupling by wiring intersection on a multilayer substrate on which the IC is packaged.

As a third problem, oscillation may occur due to parasitic capacitance and parasitic inductance in the low noise amplifier.

It is an object of the present invention to provide a pin layout which prevents degradation of high frequency characteristics of the low noise amplifier included in the IC for dual transmission/reception.

BRIEF DESCRIPTION OF THE DRAWINGS

The above and other objects of the invention will be further disclosed with reference to the following description taken in connection with the accompanying drawings, in which:

FIG. 5A is a diagram showing the bonding wire and the lead pin, and FIG. 5B is a functional equivalent circuit thereof.

DESCRIPTION OF THE INVENTION

Figure 4:
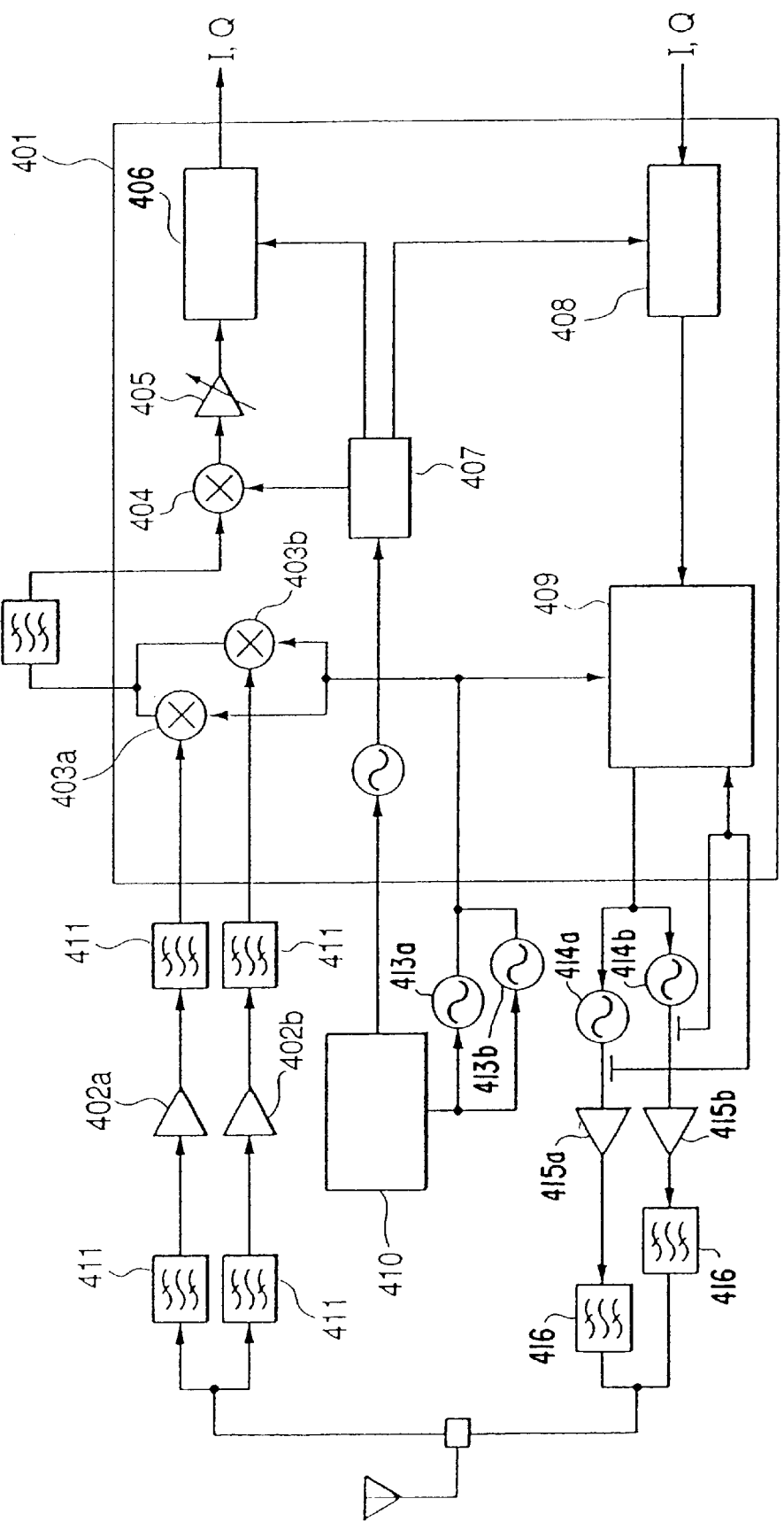
FIG. 4 is a schematic diagram of the conventional semiconductor integrated circuit for dual-band transmission/reception applied to mobile communications.

Hereinbelow, a working example of the present invention will be described with reference to FIG. 1. In the figure, numeral 100 denotes a QFP of the dual-band transmission/reception IC to which the present invention is applied. Numeral 123 denotes the low noise amplifier for the high frequency band corresponding to amplifier 402a in FIG. 4, and numeral 121 denotes the low-noise amplifier for the low frequency band corresponding to amplifier 402b in FIG. 4. Numeral 118 denotes the receiving mixer for the high frequency band corresponding to mixer 403a in FIG. 4, and numeral 119 denotes the receiving mixer for the low frequency band corresponding to the mixer 403b in FIG. 4.

Figure 1:
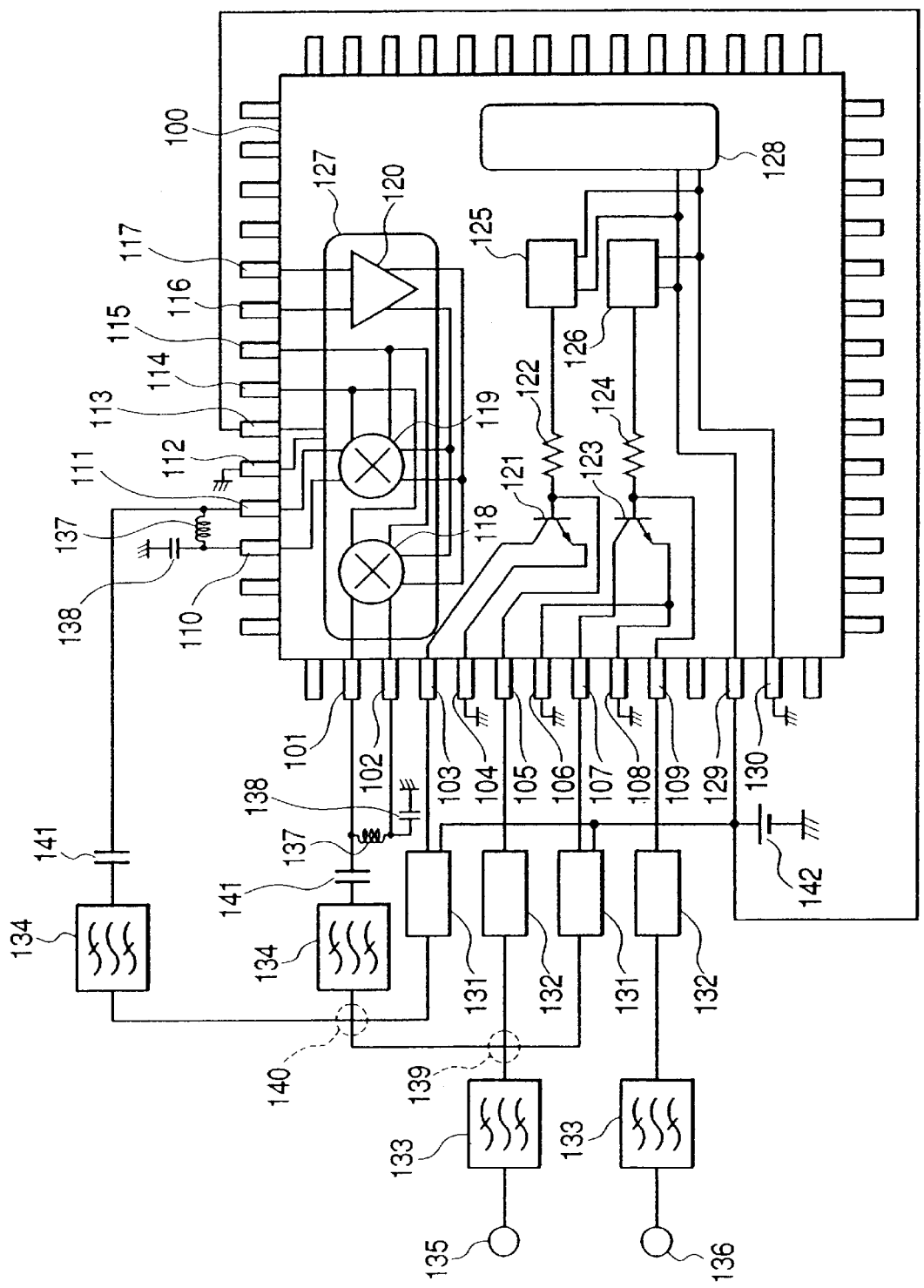
FIG. 1 is a schematic diagram representing a working example of the present invention.

In FIG. 1, the low noise amplifier 121 for the low frequency band and the low noise amplifier 123 for the high frequency band are respectively supplied with a stable bias current from a bias circuit 125 for the low noise amplifier 121 for the low frequency band and a bias circuit 126 for the low noise amplifier 123 for the high frequency band. The bias currents from the bias circuits are converted into bias voltages and supplied to the low noise amplifiers by a bias resistor 122 for the low noise amplifier for the low frequency band and a bias resistor 124 for the low noise amplifier for the high frequency band. Numeral 103 denotes an output pin of the low noise amplifier for the low frequency band; numeral 104 denotes a ground pin of the low noise amplifier for the low frequency band; numeral 105 denotes an input pin of the low noise amplifier for the low frequency band; numerals 106 and 108 denote ground pins of the low noise amplifier for the high frequency band; numeral 107 denotes an output pin of the low noise amplifier for the high frequency band; numeral 109 denotes an input pin of the low noise amplifier for the high frequency band; numeral 129 denotes a power source pin of a transmission circuit block 128; and numeral 130 denotes a ground pin of the transmission circuit block 128. Numerals 129 and 130 also denote a power source and ground of the bias circuits 125 and 126, respectively. Numeral 127 denotes a dual-band receiving mixer having the receiving mixer 118 for the high frequency band, the mixer 119 for the low frequency band, and an amplifier 120 for a local oscillation signal which supplies a local oscillation signal to both mixers. Numerals 101 and 102 denote input pins of the receiving mixer for the high frequency band; numerals 110 and 111 denote input pins of the receiving mixer for the low frequency band; numeral 112 denotes a ground pin of the mixer circuit; numeral 113 denotes a power source pin of the mixer circuit; numeral 114 and 115 denote output pins of the mixer circuit; and numeral 116 and 117 denote local oscillation signal input pins. Numeral 142 denotes a power source which supplies a power source voltage to the receiving mixers and transmission circuit via the pin 113 and the pin 129, and which supplies the power source voltage to the low noise amplifiers via an output matching circuit 131.

Hereinbelow, the feature of the pin layout of the present invention will be described.

First, the circuit of the low noise amplifier is provided at a position where the distance from an end of a pin outside the package of the low noise amplifier to a pad is the shortest. This arrangement reduces the influence of negative feedback due to parasitic inductance of the lead pins and the bonding wire, and prevents degradation of the gain and the noise characteristics. In the present working example, in the layout of the pins 103 to 109, the distance from the end of the pin outside the package to the low noise amplifier is the shortest.

Note that among these pins, the pin for which the above distance is the shortest is the pin 106, and an emitter of a bipolar transistor forming the low noise amplifier is connected to it.

Secondly, ground pins of the plural low noise amplifiers are not adjacent to each other. In the present working example, the low noise amplifier 123 for the high frequency band has two ground pins; accordingly, the influence of the feedback due to the parasitic inductance is reduced in half, and a high gain can be obtained. FIG. 5A shows bonding wires and lead pins associated with an integrated circuit board and FIG. 5B shows an equivalent circuit for the grounded bonding wires and the lead pins. In FIG. 5A numeral 502 denotes an integrated circuit board; and numeral 503 denotes an integrated circuit i.e. the low noise amplifier formed thereon. Lead pins 506 on a package support member 501 are connected to grounded pads 504 of the low noise amplifier with bonding wires 505. The equivalent circuit at this time, as shown in FIG. 5B, provides transformer coupling of the opposite sign denoted by 507, and an electric current passing through one lead pin reduces the other electric current passing through the other lead pin. Accordingly, if two adjacent lead pins are employed, the parasitic inductance is not reduced in half, but is reduced by about 70% in comparison with a case of single lead, by the influence of the degree of transformer coupling. Accordingly, to reduce the parasitic inductance, it is important that the input pin and the output pin are not adjacent to each other. Further, a ground pin is inserted therebetween such that input/output high frequency signals are not adjacent to each other. This avoids transformer coupling similar to that described above. That is, this prevents the problem that an electric current passing to one high frequency signal reduces its adjacent electric current for the other high frequency signal, so as to degrade the gain. The present working example corresponds to a layout of the pins 106 to 109. Also, a layout of the pins 103 to 105 represents an example where the high frequency signal lines are not adjacent to each other.

Thirdly, an input pin of the receiving mixer 118 for the high frequency band is provided between an input pin of the receiving mixer 119 for the low frequency band and input/output pins of the low noise amplifier 121 for the low frequency band. The input/output pins of the low noise amplifier 121 for the low frequency band are provided between the input pin of the receiving mixer 118 for the high frequency band and input/output pins of the low noise amplifier 123 for the high frequency band. The output pin 103 of the low noise amplifier 121 for the low frequency band is provided between the input pin of the receiving mixer 119 for the low frequency band and the input pin 105 of the low noise amplifier 121 for the low frequency band 121. The output pin 107 of the low noise amplifier 123 for the high frequency band is provided between the input pin of the receiving mixer 118 for the high frequency band and the input pin 109 of the low noise amplifier 123 for the high frequency band.

Since the output pin of the low noise amplifier is provided at a position closer to the receiving mixer than the input pin, the input line and the output line do not intersect each other. Note that numerals 135 and 136 denote input points for the high frequency signal, to be inputted into the low noise amplifiers 121 and 123, respectively, connected to an antenna. A band pass filter 133 provided to each point removes out-band spurs, then an input matching circuit 132 performs 50 Ω impedance matching, and inputs the high frequency signal into the respective low noise amplifiers 121 and 123. As outputs, the input matching circuit 131 performs impedance matching. Next, after the outband spurs have been removed by a band pass filter 134, then capacitances for mixer input matching circuits 138 and 141 and an inductor for mixer input matching circuit 137 generate a differential signal and input it into the receiving mixers 118 and 119. According to this wiring, wiring intersection occurs at positions 139 and 140 surrounded by a dotted line. However, since the intersection is caused between the signal lines for different bands, and when one band is used, the other band is not used, mutual interference does not occur.

Figure 2A:
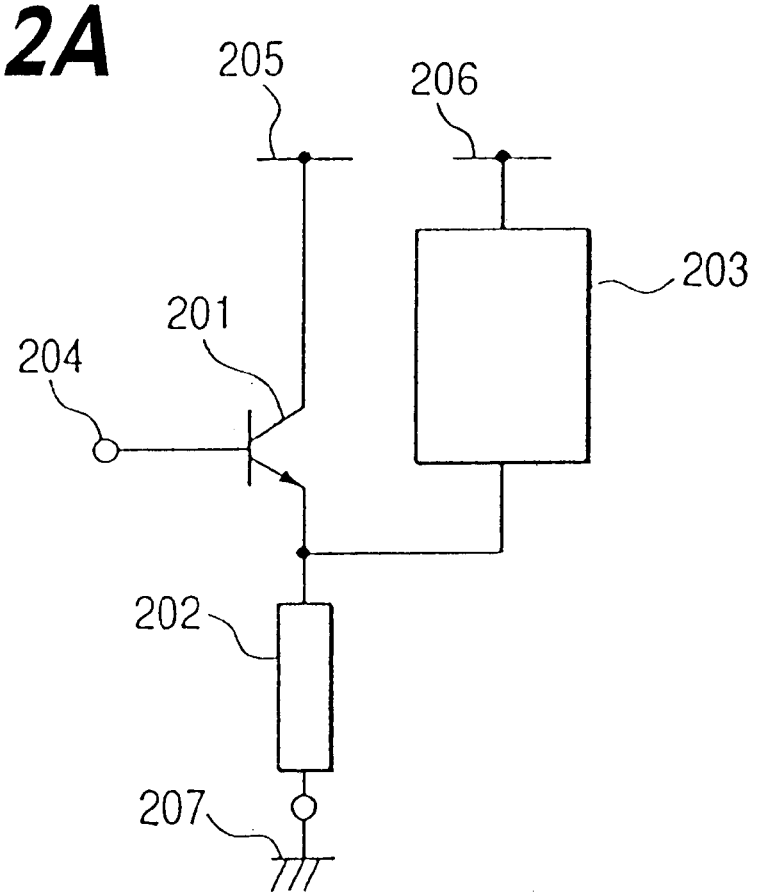
FIG. 2A is a schematic diagram of a circuit including a parasitic device of the package, in which the bias circuit has the ground node of the low noise amplifier.
Figure 2B:
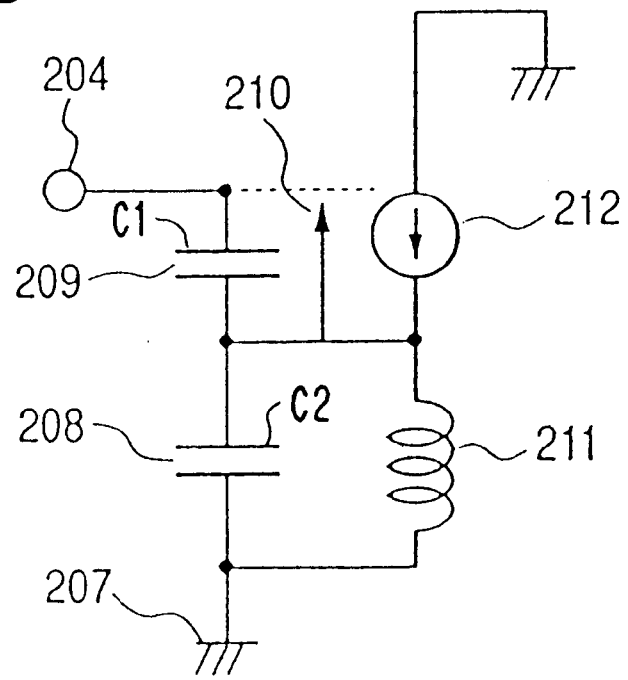
FIG. 2B represents a functional equivalent circuit thereof.

Fourthly, a ground pin of the low noise amplifier and a ground pin of the bias circuit of the low noise amplifier are respectively provided. Note that the power source pin and the ground pin of the bias circuit are also used as the power source and ground pins of the transmission block 128. FIG. 2A shows an example of a circuit including a parasitic device of the package, where a ground node is shared between a bias circuit and the low noise amplifier. Numeral 201 denotes a transistor for the low noise amplifier; numeral 202 denotes a lead for a bonding wire and the package; numeral 203 denotes the bias circuit of the low noise amplifier; numeral 205 denotes a collector bias potential of the transistor 201; numeral 206 denotes a power source potential of the bias circuit; and numeral 207 denotes the ground. FIG. 2B corresponds to an equivalent circuit for the circuit in FIG. 2A. Numeral 208 denotes a capacitance C2 as an equivalent circuit for the bias circuit; numeral 209 denotes a capacitance C1 between a transistor base and an emitter; numeral 210 denotes a potential between the base and the emitter; numeral 212 denotes mutual conductance gm of the transistor; and numeral 211 denotes an inductor L as an equivalent circuit for the bonding wire and the package lead pin. An impedance Zin viewed from an input point 204 of the transistor is represented by the following expression (1):

$$Zin = gmL/(C1(1-\omega^2 C2L)) + j(\omega^2 L - 1)/(\omega C1(1-\omega^2 CL)).$$

At this time, if $1 < \omega^2 C2L$ holds, the real part of the expression (1) is negative, then the impedance becomes a negative resistance and oscillation may occur. Accordingly, the power source and the ground are separated, to remove a parasitic capacitance of the bias circuit as the cause of oscillation.

In the present working example, a dual-band system is described, however, a system for plural bands can be realized from a similar consideration.

Figure 3:
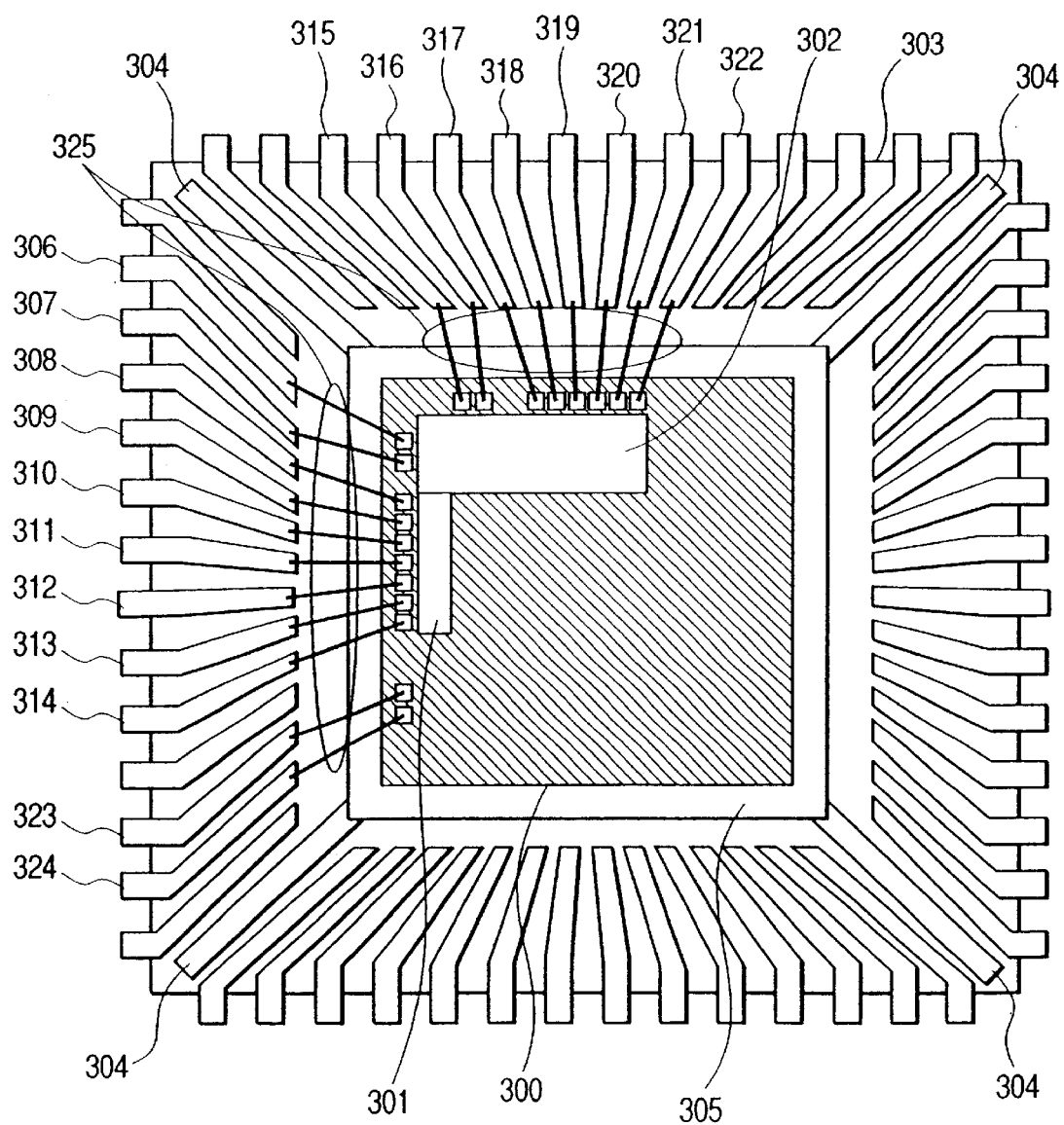
FIG. 3 is a plan view of the layout of semiconductor integrated circuit.

FIG. 3 shows the transmission/reception IC constituted with the pin layout of the present invention. Numeral 300 denotes a chip of the transmission/reception IC to which the present invention is applied; numeral 303 denotes a QFP sealing of the transmission/reception IC, corresponding to numeral 100 in FIG. 1; numeral 304 denotes a support member for a chip bonding surface 305 of the package; numeral 301 denotes a layout of the low noise amplifier for the high frequency band and the low frequency band; and numeral 302 denotes layout of the receiving mixer similarly for two bands.

Numeral 308 denotes an output pin of the low noise amplifier for the low frequency band; numeral 309 denotes a ground pin of the low noise amplifier for the low frequency band; numeral 310 denotes an input pin of the low noise amplifier for the low frequency band; numerals 311 and 313 denote ground pins of the low noise amplifier for the high frequency band; numeral 312 denotes an output pin of the low noise amplifier for the high frequency band; numeral 314 denotes, an input pin of the low noise amplifier for the high frequency band; numeral 323 denotes a power source pin of a transmission circuit block; 324, a ground pin of the transmission circuit block, corresponding to the pins 101 to 109, 129, and 130 in FIG. 1. Further, numerals 315 and 316 denote input pins of the receiving mixer for the low frequency band; numeral 317 denotes a ground pin of the mixer circuit; numeral 318 denotes a power source pin of the mixer circuit; numerals 319 and 320 denote output pins of the mixer circuit; and numerals 321 and 322 denote input pins for a local oscillation signal, corresponding to the pins 110 to 117 in FIG. 1. Numeral 325 denotes bonding wires bonded from respective pads on the chip to the lead pins as indicated above.

To realize the pin layout shown in FIG. 1, the following points are significant, as shown in FIG. 3. A circuit of the low noise amplifier is provided at a position where the distance from an end of a pin outside the package of the low noise amplifier to a pad is the shortest. Further, receiving mixers are provided so as to be adjacent to each other in the low noise amplifier as in the relation between layouts 301 and 302. Further, an input pin of the first receiving mixer is provided, then an input pin of the second receiving mixer is provided adjacent thereto, then input/output pins of the low noise amplifier to be connected to the first receiving mixer are provided adjacent thereto, and the input/output pins of the low noise amplifier to be connected to the second receiving mixer are provided adjacent thereto.

According to the present invention, first, the gain and the noise characteristic are improved by providing the circuit of the low noise amplifier at a position where the distance from the end of the pin outside the package of the low noise amplifier to the pad is shortest. Second, the transformer coupling between wires is reduced by avoiding an arrangement where the ground pins of two low noise amplifiers and the ground pins of the high frequency signal pins are respectively adjacent to each other. Third, transformer coupling between wires is reduced by the pin layout where signal wires do not intersect on a multilayer packaged substrate of the receiving mixer and the low noise amplifier. Fourthly, oscillation is reduced by separating the power source and ground pin of the low noise amplifier, and the power source and ground pin of the bias circuit.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A semiconductor integrated circuit comprising a first amplifier for a first frequency band and a second amplifier for a second frequency band into which reception signals are to be inputted, the second frequency band being different from the first frequency band, and a receiving mixer for the first frequency band and a receiving mixer for the second frequency band into which outputs from said first amplifier and from said second amplifier are to be respectively inputted, on one chip, wherein a circuit corresponding to one of said first and second amplifiers is provided at a location such that a distance from a pin end projecting to outside a package to a pad connected to said one of said first and second amplifiers is the shortest in comparison with distances from ends of other lead pins to pads corresponding thereto, wherein each of said first and second amplifiers has a bias circuit connected thereto, wherein each amplifier and corresponding bias circuit is provided with a ground pin, respectively, wherein each of said first and second amplifiers has a first terminal connected to said ground pin, a second terminal connected to an input pin and a third terminal connected to an output pin of that amplifier, and wherein the input pins and ground pins are disposed off of a single side of said one chip, said input pins are to be applied with signals of different frequencies from each other.

2. The semiconductor integrated circuit according to claim 1, wherein said first amplifier and said second amplifier include a bipolar transistor, respectively, and wherein a distance between a pad to which an emitter of said bipolar transistor of either said first amplifier or said second amplifier is connected and an end of a pin corresponding thereto is the shortest.

3. The semiconductor integrated circuit according to claim 1, wherein each of said first and second amplifiers includes a bipolar transistor having an emitter connected to the ground pin, a base connected to the input pin, and a collector connected to the output pin of that amplifier.

4. The semiconductor integrated circuit according to claim 1, wherein ground pins of said amplifiers are disposed so as not to be adjacent to each other.

5. The semiconductor integrated circuit according to claim 4, wherein each of said first and second amplifiers includes a bipolar transistor having an emitter connected to the ground pin, a base connected to the input pin, and a collector connected to the output pin of that amplifier.

6. The semiconductor integrated circuit according to claim 1, wherein said ground pin of each of said amplifiers is provided between said input pin and said output pin.

7. The semiconductor integrated circuit according to claim 6, wherein each of said first and second amplifiers includes a bipolar transistor having an emitter connected to the ground pin, a base connected to the input pin, and a collector connected to the output pin of that amplifier.

* * * * *